(12) United States Patent
Wachinger

(10) Patent No.: US 10,106,101 B2
(45) Date of Patent: Oct. 23, 2018

(54) MOTOR-VEHICLE OPERATING DEVICE HAVING A RESILIENTLY MOUNTED ACTUATING ELEMENT AND OPERATING HAPTICS

(71) Applicant: AUDI AG, Ingolstadt (DE)

(72) Inventor: Michael Wachinger, Winkelhausen (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/736,225

(22) PCT Filed: Feb. 10, 2017

(86) PCT No.: PCT/EP2017/052999
§ 371 (c)(1),
(2) Date: Dec. 13, 2017

(87) PCT Pub. No.: WO2017/140586
PCT Pub. Date: Aug. 24, 2017

(65) Prior Publication Data
US 2018/0186304 A1    Jul. 5, 2018

(30) Foreign Application Priority Data

Feb. 20, 2016    (DE) .................. 10 2016 002 021

(51) Int. Cl.
*B60R 11/02*        (2006.01)
*H01F 7/16*         (2006.01)
(Continued)

(52) U.S. Cl.
CPC .......... *B60R 11/0264* (2013.01); *G06F 3/016* (2013.01); *G06F 3/041* (2013.01);
(Continued)

(58) Field of Classification Search
CPC ........... B60R 11/0264; B60R 2011/008; G06F 3/016; G06F 3/041; G06F 2203/04105; H01F 7/064; H01F 7/16
See application file for complete search history.

(56) References Cited

U.S. PATENT DOCUMENTS 6,118,435 A *   9/2000  Fujita ...................... G06F 3/016
                                                    345/173
7,175,291 B1*   2/2007  Li ............................. B60R 1/12
                                                    359/838
(Continued)

FOREIGN PATENT DOCUMENTS

DE          103 12 338 A1    10/2004
DE     10 2006 021 593 A1    11/2007
(Continued)

OTHER PUBLICATIONS

German Office Action dated Oct. 19, 2016 from German Patent Application No. 10 2016 002 021.0, 8 pages.
(Continued)

*Primary Examiner* — Latanya Bibbins
(74) *Attorney, Agent, or Firm* — Staas & Halsey LLP

(57) ABSTRACT

A housing, an actuating element, and a spring element are included in an operating device for a motor vehicle. The housing fastens the operating device. The actuating element is mounted for translatory deflection from a resting position with respect to the housing by the application of an actuating force. The spring element is resiliently mounted and a restoring force is applied to the actuating element in the direction of the resting position in the event of the translatory deflection. The spring element can be a plate or a strip and is supported by at least two supporting elements so as to be immovable with respect to the housing at respective support points. An intermediate region is defined between the support points and the actuating element lies against the
(Continued)

spring element at two opposite ends of the spring element outside of the intermediate region.

15 Claims, 1 Drawing Sheet

(51) Int. Cl.
    *H01F 7/06*     (2006.01)
    *G06F 3/01*     (2006.01)
    *G06F 3/041*     (2006.01)
    *B60R 11/00*     (2006.01)

(52) U.S. Cl.
    CPC ............... *H01F 7/064* (2013.01); *H01F 7/16* (2013.01); *B60R 2011/008* (2013.01); *G06F 2203/04105* (2013.01)

(56) References Cited

U.S. PATENT DOCUMENTS

| | | | |
|---|---|---|---|
| 2005/0034340 A1* | 2/2005 | Burke | G09F 21/04 40/591 |
| 2010/0172080 A1* | 7/2010 | Bestle | G06F 3/016 361/679.21 |
| 2013/0257817 A1 | 10/2013 | Yliaho | |

FOREIGN PATENT DOCUMENTS

| | | |
|---|---|---|
| DE | 10 2014 007 988 A1 | 12/2014 |
| DE | 10 2016 002 021.0 | 2/2016 |
| DE | 10 2016 002 021 B3 | 7/2017 |
| KR | 10-2012-00013202 | 1/2012 |
| WO | 2008/151863 A1 | 12/2008 |
| WO | PCT/EP2017/052999 | 2/2017 |

OTHER PUBLICATIONS

German Office Action dated Apr. 4, 2017 from German Patent Application No. 10 2016 002 021.0, 8 pages.
International Search Report dated May 8, 2017 from International Patent Application No. PCT/EP2016/052999, 2 pages.

* cited by examiner

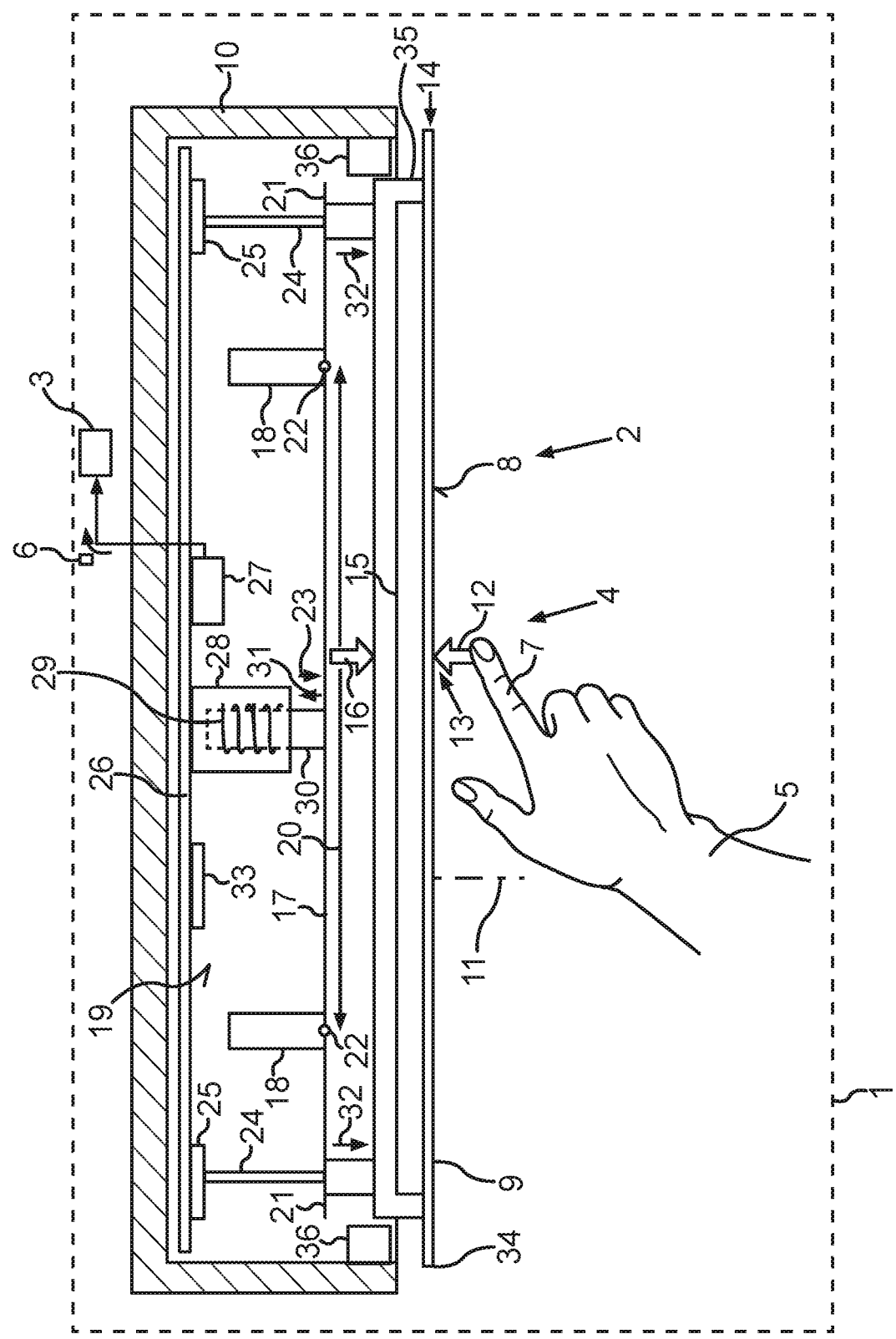

MOTOR-VEHICLE OPERATING DEVICE HAVING A RESILIENTLY MOUNTED ACTUATING ELEMENT AND OPERATING HAPTICS

CROSS REFERENCE TO RELATED APPLICATIONS

This application is a U.S. national stage of International Application No. PCT/EP2017/052999, filed on Feb. 10, 2017. The International Application claims the priority benefit of German Application No. 10 2016 002 021.0 filed on Feb. 20, 2016. Both the International Application and the German Application are incorporated by reference herein in their entirety.

BACKGROUND

Described herein is an operator control apparatus for a motor vehicle. An operating element which is held in a housing such that it can be deflected in a translatory manner is provided by the operator control apparatus. The operating element can be, for example, a touchscreen. In this case, the operating element is resiliently mounted, for which purpose a spring element which applies a restoring force to the operating element in the direction of an inoperative position is provided. A motor vehicle including the operator control apparatus is also described herein.

An operator control apparatus is described in German Patent Application 103 12 338 A1. According to the document, a touch-sensitive detection apparatus is mounted in a housing on four spring strips, each of the spring strips being bent in the shape of a dome and being mounted on two supporting elements. The respective dome-shaped formation is arranged between the two supporting elements and serves as a support point for the detection apparatus. In the case of an arrangement of this kind, it is difficult to arrange an actuator for providing haptic feedback on the detection apparatus since, here, the detection apparatus is independently mounted at four points and the actuator accordingly has to be able to act on all four support points for effective haptic feedback.

Four-fold input of haptic signals is described by Korean Patent Application 2012 000 1302 A. According to the document, a movably mounted operating element in the form of a panel is mounted on four vibration loudspeakers which hold the panel and apply a vibration as required. One disadvantage of this arrangement is that resilient mounting of the panel is possible only to a limited extent since the vibration loudspeakers have to be structurally adapted for this purpose.

German Patent Application 10 2006 021 593 A1 describes an actuator device for generating a vibration signal on an operating element, which actuator device is fastened directly to the operating element and, on account of its mass inertia, can input a vibration into the operating element. One disadvantage of this solution is that, owing to the arrangement of the relatively heavy actuator device on the operating element, the operating element is slow and therefore can be operated by a user only with a correspondingly large operating force.

SUMMARY

An aspect of the disclosure is to provide an operator control apparatus including an operating element which can be deflected in a translatory manner, is resiliently mounted, and provides a central point of action for applying an actuator force to the operating element and/or for detecting a user operating force which acts on the operating element.

Described herein is an operator control apparatus for a motor vehicle. The operator control apparatus has, in a manner which is known per se, a housing for fastening the operator control apparatus in the motor vehicle and an operating element. The operating element is mounted in the housing in such a way that it can be deflected out of an inoperative position in a translatory manner by application of an operating force. The operating element may be, for example, a key or a key strip or else a touchscreen or a touchpad (touch-sensitive input area). Furthermore, a spring element by way of which the operating element is resiliently mounted and by way of which a restoring force is applied to the operating element in the direction of the inoperative position in the event of the translatory deflection out of the inoperative position is provided.

In order to then provide a central point of action for providing a force for haptic feedback or for tapping off or measuring the user operating force which acts on the operating element, it is provided that the spring element is designed as a plate or a strip and is mounted in an immovable manner with respect to the housing at a respective bearing point by at least two bearing elements. Therefore, two bearing blocks are provided in the operator control apparatus, which bearing blocks are connected to the housing in a manner fixed in terms of movement. The spring element is arranged on these bearing blocks, wherein the respective fastening region of the spring element to the bearing blocks constitutes a bearing point. Since there are then two bearing elements and therefore also two bearing points on the spring element, an intermediate region is defined between the bearing points. In this case, the operating element rests against the spring element at two opposite ends of the spring element outside the intermediate region.

The disclosure provides the advantage that, in the intermediate region, a deformation of the spring element is correlated to a corresponding deformation of the two opposite ends of the spring element and therefore the point of action or tapping-off point is provided in the intermediate region, by way of which point the two opposite ends of the spring element can be simultaneously influenced and, for example, have a force applied to them, so that this force can also be applied to the operating element by using both ends for example.

Optional developments, of which the features result in additional advantages, form part of the disclosure.

According to one development, a stationary rotation region for elastic bending of the spring element is formed at each of the bearing points. If the user presses the operating element with the operating force, this operating force is transmitted to the operating element at the ends of the spring element. In the process, the spring element bends around the two rotation regions of the bearing elements. In the event of the resulting translatory deflection, the intermediate region is then bent counter to the operating element in comparison to the inoperative position of the operating element. In other words, a change in direction of the deflection of the spring element takes place owing to the stationary rotation regions in the bearing points. This can be used in an advantageous manner in order to be able to move unidirectionally acting actuators and/or sensors in the intermediate region counter to that direction into which the operating element is deflected.

One development provides that a plunger element, for example a bar or a rod, is in each case provided at at least one of the opposite ends of the spring element, the respective end acting on a force sensor by way of the plunger element in the event of the translatory deflection of the operating element. In particular, the plunger element is arranged on a side of the spring element which is situated opposite the operating element. In particular, the plunger element and a support region of the operating element on the spring element are arranged without an offset in relation to one another on the spring element, and therefore the operating force is transmitted directly into the plunger element. The development has the advantage that direct force measurement of the operating force is possible by using each force sensor.

One development provides that an actuator device is provided on a side of the spring element which is averted from the operating element in the intermediate region, the actuator device being connected to the housing and being designed to apply a force which acts along an axis of action of the operating force to the spring element in the intermediate region. An actuator device of this type can be provided, for example, on the basis of a piezo element. The actuator device is connected to the spring element and therefore generates the force on the spring element in the intermediate region, which spring element transmits the force to the operating element by using its ends. A time profile of the force is low-pass-filtered owing to this coupling by using the spring element.

As already described, one particular advantage of the arrangement in the intermediate region is that force is reversed by using the bearing elements. According to one development, this is utilized by the actuator device exclusively generating a tensile force as the described force. This results in the advantage that the actuator device can be designed in a particularly simple manner in technical terms.

Therefore, one development provides, for this purpose, that the actuator device, for the purpose of providing the tensile force, has an electrical coil for generating a magnetic attraction force as the tensile force. An electrical coil as a constituent part of an actuator device has the advantage that a relatively large tensile force, which acts only in a unidirectional manner however, can be generated using technically simple devices.

One development provides that a control device is provided, which is designed to drive the actuator device during and/or after the translatory deflection of the operating element by using an actuating signal in such a way that the actuator device supplies a haptic signal, which counteracts the operating force, to the operating element by using the spring element and/or dampens a natural vibration of the operating element around the inoperative position. The control device can be realized, for example, on the basis of a processor device, for example a microcontroller or a microprocessor. The haptic signal generated can be, for example, a vibration or advantageously and for example a counterpulse. In particular, the control device can be set in such a way that the counterpulse is generated when a threshold value for the operating force is exceeded, wherein the operating force can be ascertained, for example, by using the at least one force sensor. By way of the described arrangement, a natural vibration of the operating element can also be damped or prevented by using a single actuator device, for example a single electrical coil, using technically simple devices. For this purpose, the actuator device, in particular the electrical coil, can generate a countermovement against the natural vibration by using the actuating signal or else, for example, simply activate a generator mode by short-circuiting electrical connections of the actuator device, so that the vibration movement of the natural vibration can be damped by converting the kinetic energy into heat.

One development provides that the actuating signal is designed as a PWM signal (PWM=pulse width modulation). This results in the advantage that a time profile of a magnitude of the force of the actuator device can be set or predefined using a simple switching element, for example a transistor, with only two switching states. As an alternative to this, the actuating signal can have a time profile according to a step function with at least one constant section between a minimum value and a maximum value. Owing to a step function, the operating element can be moved in steps from the translatory deflection back to the inoperative position, so that a natural vibration of the operating element is avoided as a result.

As already stated, the operating element may be a key. For example, a plurality of different functionalities of the operator control apparatus can be activated or selected by using the operating element. For this purpose, one development provides that the operating element, for the purpose of providing a contact area, has a plate or panel, for example, a glass panel, and a sensor device for distinguishing between a plurality of different contact points is arranged on the panel. An operating element of this kind can be provided, in the described manner, as a touchscreen or touchpad. One development provides that the operating element is designed as a switch strip which has a plurality of different touch regions. Each touch region can have a dedicated proximity sensor for detecting contact with the touch region.

Up until this point, only translatory deflection of the operating element has been discussed. A translatory movement of this kind of the operating element out of the inoperative position is also, for example, exclusively permitted. In order to ensure this, one development provides that a guide device is provided, the guide device guiding a movement of the operating element with respect to the housing in such a way that the operating element can be moved solely along one direction of the translatory deflection. By way of example, a rail device for guiding the operating element can be provided for this purpose. This development has the advantage that the operating element does not tilt in the housing when it is deflected out of the inoperative position. This is possible for example in the case of a panel in the form of a touchscreen or touchpad with a correspondingly large contact area.

As already stated, a motor vehicle which includes the operator control apparatus as described herein also forms part of the disclosure. For example, at least one vehicle component can be subjected to operator control or coupled in the motor vehicle by using the operator control apparatus. By way of example, an infotainment system and/or an air-conditioning device and/or a vehicle seat adjusting device can be subjected to operator control as the vehicle component.

BRIEF DESCRIPTION OF THE DRAWINGS

These and other aspects and advantages will become more apparent and more readily appreciated from the following description of the exemplary embodiments, taken in conjunction with the attached single drawing, of which:

An exemplary embodiment in the single drawing is a schematic illustration of a motor vehicle including an operator control apparatus illustrated in cross section.

DETAILED DESCRIPTION OF THE PREFERRED EMBODIMENT

Reference will now be made in detail to preferred embodiments, examples of which are illustrated in the accompanying drawing, wherein like reference numerals refer to like elements throughout.

Exemplary embodiments are explained below with reference to the single drawing. In the exemplary embodiments, the described components of the embodiments each constitute individual features which are to be considered independently of one another and which each also develop the disclosure independently of one another and therefore are also to be considered individually or in a combination other than that shown. Furthermore, the described embodiments can also be supplemented with further features from amongst those which have already been described.

The single drawing shows a motor vehicle 1, which may be, for example, a motor car, for example a passenger car. The motor vehicle 1 can have an operator control apparatus 2 which can be provided, for example, to subject at least one motor vehicle component 3 to operator control. The at least one motor vehicle component 3 can have, for example, an infotainment system and/or an air-conditioning device and/or a vehicle seat adjusting device.

The operator control apparatus 2 can generate a control signal 6 for the at least one vehicle component 3 depending on a touch operation 4 by a user 5. The user 5 can perform the touch operation 4, for example, by way of a finger 7 touching a touch-sensitive contact area 8. The contact area 8 is provided by an operating element 9 which is mounted in a housing 10 of the operator control apparatus 2 such that it can be deflected along a deflection axis or axis of action 11. By way of applying an operating force 12 to the contact area 8 at a contact point 13 of the contact area 8, the operating element 9 is moved out of an inoperative position 14, illustrated in the drawing, in the event of the touch operation 4. In this case, for example, coordinates of the contact point 13 on the contact area 8 can be ascertained and indicated by a sensor device 15.

In the event of the deflection of the operating element 9 out of the inoperative position 14, a restoring force 16 acts on the operating element 9 in the direction of the inoperative position 14. This restoring force 16 can be generated by a spring element 17 which can be designed as a panel or strip, that is to say as a spring strip. By way of example, the spring strip can be a steel strip which can be produced, for example, as a punched part. The spring element 17 can be arranged on two bearing elements 18 in the housing 10, it being possible for the bearing elements to be fixedly connected to a housing wall 19 of the housing 10. In this case, the operating element 9 is fastened to the spring element 17 at a respective end 21 of the spring element 17 outside an intermediate region 20 which is defined between the bearing elements 18. In the event of the deflection of the operating element 9 out of the inoperative position 14, the spring element 17 bends around rotation points 22 which can also form the boundaries for the intermediate region 20 on the bearing elements 18. While the ends 21 are deflected along the axis of action 11 in the same direction as the operating element 9 as a result, the intermediate region 20 executes an opposing movement in an opposite direction 23 toward the operating element 9 during the bending.

Plungers 24 can be arranged at the ends 21, which plungers can at least partially transmit the operating force 12 to force sensors 25. The force can be, for example, detected at opposite ends of the operating element 9 by using the plunger elements 24 and the force sensors 25. The force sensors 25 can be arranged on a circuit board or printed circuit board 26 which is arranged fixedly in the housing 10. By virtue of the circuit board 26, the force sensors 25 can be connected to a control device 27 by way of which the control signal 6 for the motor vehicle components 3 can be generated depending on a force which is detected by using the force sensors 25. In this case, it can be provided that the control signal 6 is generated as soon as the detected force exceeds a threshold value.

In order to provide the user 5 with haptic feedback at the contact area 8 when the control signal 6 is generated, an actuator device 28 which can be formed, for example, from a piezo element or from an arrangement including an electrical coil 29 and a magnetic armature element 30 arranged therein can be provided. The armature element 30 is drawn into the actuator device 28 against the opposing direction 23 by current being applied to the coil 29. Owing to the rotation points 22, the spring element 17 acts, in this case, as an elastic lever which acts on both ends 21, so that the force 31 which is generated by the actuator device 28 can act as haptic feedback 32, for example in the form of a jolt or a counterpulse against the operating force 12, on the finger 7.

Acoustic feedback can likewise be generated by the control device 27 by using a loudspeaker 33. Therefore, overall, operation of the operating element 9 produces an effect like that of a mechanical key which clicks when it is operated. However, in this case, the operating element 9 can be designed, for example, as a touchscreen or touchpad or switch strip including a plurality of switches. By way of example, the operating element can include a panel 34 which can be arranged on a carrier body 35 for stabilization purposes. In order to design the carrier body 35 with a particularly low carrier mass, the carrier body can have a honeycomb structure or honeycomb shape.

Therefore, a touchscreen with haptics can be provided by the operator control apparatus 1. Owing to a guide device 36, it is possible to ensure that there is only 1 degree of freedom in the movement along the axis of action 11, so that the operating direction and the effect of the actuator device 28 lie on the same axis of action 11.

The operating force 12 is transmitted to the force sensors 25 by using the plunger elements 24 by way of a spring strip in the form of the spring element 17 which is mounted on two bearing blocks in the form of the bearing elements 18. The actuator device 28 and the loudspeaker 30 can be tripped when a set threshold value for the operating force is exceeded. In this case, the actuator device 28, for example, acts centrally on the spring element 17. As a result, the actuator device 28 acts counter to the operating direction of the operating force 12, but on the same axis of action 11.

Therefore, overall, the example shows how a construction of a touchscreen including haptics and acoustics can be provided.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:
1. An operator control apparatus for a motor vehicle, comprising:
   a housing configured to fasten the operator control apparatus in the motor vehicle;
   an operating element mounted such that the operating element can be deflected out of an inoperative position in a translatory manner with respect to the housing by application of an operating force to the operating element;
   a spring element, to which the operating element is resiliently mounted, configured as a plate or a strip and configured to apply a restoring force to the operating element in a direction of the inoperative position in response to the operating element being deflected in the translatory manner; and
   at least two bearing elements having respective bearing points at which the spring element is mounted thereto in an immovable manner with respect to the housing, and the operating element rests against the spring element at two opposite ends of the spring element outside an intermediate region defined between the bearing points.

2. The operator control apparatus as claimed in claim 1, wherein each of the bearing points includes a stationary rotation region configured to elastically bend the spring element, and
   the intermediate region is bent counter to the operating element in response to the bending of the spring element when the operating element is deflected in the translatory manner.

3. The operator control apparatus as claimed in claim 1, further comprising:
   a plunger element disposed at at least one of the two opposite ends of the spring element; and
   a force sensor to receive a force by an end of the plunger element when the operating element is deflected in the translatory manner.

4. The operator control apparatus as claimed in claim 1, further comprising an actuator device disposed on a side of the spring element facing away from the operating element in the intermediate region, the actuator device being connected to the housing and configured to apply an actuating force to the spring element in the intermediate region which acts along an axis of action of the operating force.

5. The operator control apparatus as claimed in claim 4, wherein the actuating force is a tensile force.

6. The operator control apparatus as claimed in claim 5, wherein the actuator device includes an electrical coil configured to generate a magnetic attraction force.

7. The operator control apparatus as claimed in claim 4, further comprising:
   a controller configured to drive the actuator device during and/or after the operating element is deflected in the translatory manner by an actuating signal, and
   wherein the actuator device is configured to supply haptic feedback to the operating element, the haptic feedback counteracting the operating force, to the operating element via the spring element and/or dampening a natural vibration of the operating element around the inoperative position.

8. The operator control apparatus as claimed in claim 7, wherein the actuating signal is a PWM signal or has a time profile according to a step function with at least one constant section between a minimum value and a maximum value.

9. The operator control apparatus as claimed in claim 1, wherein the operating element includes a panel which provides a contact area for receiving the operating force, the panel including a sensor device configured to distinguish between a plurality of different contact points on the panel.

10. A motor vehicle, comprising:
    a chassis; and
    an operator control apparatus including:
       a housing configured to fasten the operator control apparatus in the motor vehicle,
       an operating element mounted such that the operating element can be deflected out of an inoperative position in a translatory manner with respect to the housing by application of an operating force to the operating element,
       a spring element, to which the operating element is resiliently mounted, configured as a plate or a strip and configured to apply a restoring force to the operating element in a direction of the inoperative position in response to the operating element being deflected in the translatory manner, and
       at least two bearing elements having respective bearing points at which the spring element is mounted thereto in an immovable manner with respect to the housing, and the operating element rests against the spring element at two opposite ends of the spring element outside an intermediate region defined between the bearing points.

11. The motor vehicle as claimed in claim 10, further comprising at least one motor vehicle component including at least one of an infotainment system, an air-conditioning device, and a vehicle seat adjusting device,
    wherein the operator control apparatus is configured to generate a control signal for the at least one motor vehicle component in response to the operating force being applied to the operating element.

12. The motor vehicle as claimed in claim 11, wherein
    the operating element includes a touch-sensitive contact area configured to sense a touch of a user, and
    when the operating force is applied to the touch-sensitive contact area of the operating element, the operating element is moved out of the inoperative position.

13. The motor vehicle as claimed in claim 11, wherein the operator control apparatus further includes:
    at least one force sensor configured to detect an amount of the operating force applied to the operating element, and
    a controller, connected to the at least one force sensor, configured to generate the control signal when the amount of the operating force detected by the at least one force sensor exceeds a threshold value.

14. The motor vehicle as claimed in claim 13, wherein the operator control apparatus further includes:
    a first plunger having a first end connected to one end of the spring element and a second end connected to a first force sensor among the at least one force sensor, and
    a second plunger having a first end connected to another end of the spring element and a second end connected to a second force sensor among the at least one force sensor,
    wherein
    the first plunger is disposed outside of the intermediate region and outside of a first bearing point among the bearing points which is disposed outside of one side of the intermediate region, and
    the second plunger is disposed outside of the intermediate region and outside of a second bearing point among the bearing points which is disposed outside of another side of the intermediate region.

15. The motor vehicle as claimed in claim 10, wherein the operator control apparatus further includes:
- a first guide disposed on an inner surface of a first inner side of the housing and adjacent to a first side of the operating element, and
- a second guide disposed on an inner surface of a second inner side of the housing and adjacent to a second side of the operating element,
- wherein the first guide and the second guide are configured to restrict movement of the operating element such that the operating element can only move along a single axis of action, thereby preventing the operating element from tilting in the housing when the operating element is deflected in the translatory manner.

* * * * *